United States Patent [19]
Eguchi et al.

[11] Patent Number: 5,446,301
[45] Date of Patent: * Aug. 29, 1995

[54] SEMICONDUCTOR DEVICE INCLUDING SEMICONDUCTOR LAYER HAVING IMPURITY REGION AND METHOD OF MANUFACTURING THE SAME

[75] Inventors: Koji Eguchi; Natsuo Ajika; Kazuyuki Sugahara, all of Hyogo, Japan

[73] Assignee: Mitsubishi Denki Kabushiki Kaisha, Tokyo, Japan

[*] Notice: The portion of the term of this patent subsequent to Jan. 10, 2012 has been disclaimed.

[21] Appl. No.: 274,517

[22] Filed: Jul. 13, 1994

Related U.S. Application Data

[63] Continuation of Ser. No. 838,993, Feb. 21, 1992, Pat. No. 5,381,029.

[30] Foreign Application Priority Data

Mar. 1, 1991 [JP] Japan .................................. 3-036259
Sep. 11, 1991 [JP] Japan .................................. 3-230648

[51] Int. Cl.⁶ ...................... H01L 27/01; H01L 29/06
[52] U.S. Cl. ...................... 257/354; 257/66; 257/347; 257/496
[58] Field of Search ............... 257/354, 347, 496, 66

[56] References Cited

U.S. PATENT DOCUMENTS

| | | | |
|---|---|---|---|
| 4,546,376 | 10/1985 | Nakata et al. | 257/354 |
| 4,753,896 | 6/1988 | Matloubian | 257/350 |
| 4,822,751 | 4/1989 | Ishizu et al. | 257/70 |
| 5,089,870 | 2/1992 | Haond | 257/354 |

FOREIGN PATENT DOCUMENTS

| | | |
|---|---|---|
| 58-200572 | 11/1983 | Japan . |
| 60-7729 | 1/1985 | Japan . |
| 60-163457 | 8/1985 | Japan . |
| 61-247032 | 11/1986 | Japan . |
| 1-122167 | 5/1989 | Japan . |
| 1-295463 | 11/1989 | Japan . |

OTHER PUBLICATIONS

"Redeposition—A serious problem in rf sputter etching of structures with micronmeter dimensions", by H. W. Lehmann et al., J. Vac. Sci. Technol., vol. 14, No. 1, Jan./Feb. 1977, pp. 281–284.

*Primary Examiner*—Mark V. Prenty
*Attorney, Agent, or Firm*—Lowe, Price, LeBlanc & Becker

[57] ABSTRACT

A semiconductor device capable of effectively preventing a dielectric breakdown of a gate oxide film without adversely affecting the characteristics of a transistor and a process of manufacturing the same are disclosed. The semiconductor device comprises a SOI film 2 whose upper angular parts are rounded off by sputter etching and a gate oxide film 3 formed on SOI film 2 with an almost uniform thickness. Therefore, electric field concentration in the upper angular parts of SOI film 2 is reduced. Furthermore, the control characteristics of the transistor are enhanced by the uniform gate oxide film 3. As a result, a dielectric breakdown of the gate oxide film is effectively prevented without adversely affecting the characteristics of the transistor. Sputter etching enabling processing at a low temperature is used, so that the upper angular parts of SOI film 2 are rounded off without adversely affecting a semiconductor element formed in the lower layer.

2 Claims, 13 Drawing Sheets

SUBSTRATE BIAS VOLTAGE

SUBSTRATE BIAS VOLTAGE

−50 (V)

−100 ~ −150 (V)

−400 (V)

SEMICONDUCTOR DEVICE INCLUDING SEMICONDUCTOR LAYER HAVING IMPURITY REGION AND METHOD OF MANUFACTURING THE SAME

This application is a continuation of application Ser. No. 07/838,993, filed Feb. 21, 1992, now U.S. Pat. No. 5,381,029.

BACKGROUND OF THE INVENTION

1. Field of the Invention

The present invention relates to semiconductor devices and a method of manufacturing the same, and, more particularly, to a semiconductor device including a semiconductor element formed on an insulating layer and a method of manufacturing the same.

2. Description of the Background Art

Conventionally, a three-dimensional integrated circuit including active elements layered in a three-dimensional manner is known as aiming to enhance integration density and functions of a semiconductor device. In a specific configuration, semiconductor layers and insulating layers are alternately layered. Then, active elements are formed in respective semiconductor layers. Such a structure including semiconductor layers (Si thin films) formed on insulating layers is referred to as a SOI (Silicon On Insulator) structure.

FIG. 14 is a sectional view illustrating a semiconductor device of a conventional SOI structure. Referring to FIG. 14, the semiconductor device of a SOI structure comprises a semiconductor substrate 101, a p well 102 formed in a prescribed region of the surface of semiconductor substrate 101, a n well 103 formed adjacent to p well 102, n-type impurity regions 104, 105 formed in p well 102 with a prescribed space between them, a gate electrode 108 formed on p well 102 between n-type impurity regions 104 and 105 with an insulating film interposed, p-type impurity regions 106, 107 formed in n well 103 with a prescribed space between them, a gate electrode 109 formed on n well 103 between p-type impurity regions 106, 107 with an insulating film interposed, an insulating layer 21 formed to cover the whole surface, and a wiring layer 110 formed in a contact hole 21a provided in insulating layer 21 to be electrically connected to gate electrode 109. In such a configuration, a semiconductor element (a CMOS) of a first layer is formed beneath insulating layer 21.

The semiconductor device further comprises a SOI film (a semiconductor film) 22 formed with a prescribed width on insulating layer 21, a gate oxide film 23 formed to cover SOI film 22, a gate electrode 24 formed on gate oxide film 23 and insulating layer 21, and an oxide film 25 formed on gate electrode 24 and on wiring layer 110. A channel region 22c is formed in the upper part of SOI film 22. A semiconductor element (a MOS transistor) of a second layer is formed with SOI film 22, gate oxide film 23, and gate electrode 24.

FIG. 15 is an enlarged plan view of the SOI structure portion of the semiconductor device illustrated in FIG. 14. FIG. 16 is a sectional view of the semiconductor device illustrated in FIG. 15 taken along the line X—X. Referring to FIGS. 15 and 16, the conventional SOI structure will be described. n-type impurity regions 22a, 22b are formed in SOI film 22 on insulating layer 21 in a direction crossing gate electrode 24 with a prescribed space between them. Impurity regions 22a, 22b are formed in a region including the upper edge portion of SOI film 22. Specifically, impurity regions 22a, 22b are formed to reach a prescribed depth from the upper surface toward the bottom surface of SOI film 22. Then, a source contact 26 is formed on impurity region 22a. A drain contact 28 is formed in impurity region 22b. A gate contact 27 is formed in a prescribed position in gate electrode 24.

FIG. 17 is a cross sectional view for describing a process for manufacturing the semiconductor device illustrated in FIG. 16. Referring to FIG. 17, the process for manufacturing the semiconductor device will be described in the following.

First, as illustrated in FIG. 17(a), a SOI film 22 comprising a mono-crystal silicon film having a thickness of approximately 5000 Å is formed on insulating layer 21.

Next, as illustrated in FIG. 17(b), patterning is performed on SOI film 22 by performing anisotropic etching. Then, the upper side ends of SOI film 22 patterned by anisotropic etching are of angular shapes of approximately 90°.

Next, as illustrated in FIG. 17(c), a gate oxide film 23 is formed over SOI film 22.

Next, as illustrated in FIG. 17(d), a gate electrode 24 comprising polysilicon is formed to cover gate oxide film 23.

Next, as illustrated in FIG. 17(e), a n-type impurity region (not shown) is formed by ion implantation of an impurity using gate electrode 24 as a mask. A channel region 22c is formed by this. Then, an oxide film 25 is formed to cover gate electrode 24.

Conventionally, a semiconductor device of SOI structure was formed as described above.

As described above, in a semiconductor device of a conventional SOI structure, SOI film 22 was patterned by performing anisotropic etching on SOI film 22.

According to the process of anisotropic etching performed on SOI film 22, however, the upper side ends of SOI film 22 are of angular shapes, and then there was a problem that in the case of the angular shapes being acute angles of less than 90°, a dielectric breakdown tends to be caused by electric field concentration. In a SOI structure illustrated in FIG. 9, a channel region is formed also on the upper side ends of SOI film 22. Therefore, there was a problem that if the upper side ends of SOI film 22 are of angular shapes, it adversely affects the control characteristics of a transistor.

Conventionally, various methods have been proposed as a method of rounding off the angular shapes of the upper side ends of SOI film 22. These are disclosed in, for example, Japanese Patent Laying-Open No. 60-163457 (1985). FIG. 18 is a sectional view illustrating a semiconductor device of the disclosed SOI structure. FIG. 19 is a partial enlarged view of a part A of the semiconductor device illustrated in FIG. 18. Referring to FIGS. 18 and 19, according to the proposed technique, an element forming region (a SOI film) 32 is formed on an insulating layer 31. Then, an insulating film 33 is formed on element formation region 32. The angular shapes of the upper side ends of element formation region 32 are rounded off by isotropic etching using insulating film 33 as a mask. If one of the shapes rounded off by isotropic etching is enlarged, it is a shape as illustrated in FIG. 19. Specifically, the shape as a whole is a rounded shape, while, to be precise, two angular parts 32a, 32b in which each of straight lines tangent to the etched curve at respective parts 32a, 32b makes an angle of 90° with a surface of element formation region 32 are newly formed. There is a possibility that angular parts 32a, 32b cause a dielectric breakdown due to electric field concentration. Therefore, according to the proposed conventional technique, it is considered difficult to effectively prevent the dielectric breakdown caused by electric field concentration.

Another proposed example is disclosed, for example, in Patent Laying-Open No. 1-295463 (1989). FIG. 20 is a plan view illustrating a semiconductor device of the proposed SOI structure. FIG. 21 is a sectional view of the semiconductor device illustrated in FIG. 20 taken along the line X—X. Referring to FIGS. 20 and 21, the proposed semiconductor device comprises a Si monocrystal plate (a semiconductor substrate) 40, a field insulating film (an insulating layer) 41 formed over Si monocrystal plate 40, a semiconductor island (a SOI film) 42 formed on field insulating film 41, dummy insulating films 45 formed on the sidewall parts of semiconductor island 42, a gate insulating film 43 formed over semiconductor island 42 and dummy insulating films 45, and a gate electrode 44 formed on gate insulating film 43. According to the proposed technique, a method is employed in which dry oxidation is performed at about 1200° C. for approximately 6 hours for the purpose of rounding off the upper side ends of semiconductor island (SOI film) 42.

However, normally, in a semiconductor device of a SOI structure, a semiconductor device is formed beneath field insulating film (an insulating layer) 41. Then, there is a problem that if thermal oxidation is performed on such a semiconductor device at 1200° C. for 6 hours, characteristics of the semiconductor element of the lower layer are changed. Therefore, it is considered difficult to apply the proposed method to a semiconductor device of a SOI structure in which an element such as a CMOS is formed in a lower layer. Furthermore, in the proposed example, dummy insulating films 45 are formed on both sidewall parts of semiconductor island 42, and a channel region 42c is formed only in the upper central part of semiconductor island 42. The upper side ends of semiconductor island 42 do not influence the characteristics of the transistor themselves. An example is considered in which the proposed improved example is applied to the semiconductor device illustrated in FIG. 16, for example. FIG. 22 is a sectional view illustrating an example in which the conventional proposed example illustrated in FIG. 21 is applied to the conventional semiconductor device illustrated in FIG. 16. Referring to FIG. 22, if the proposed example is applied to the conventional semiconductor device illustrated in FIG. 16, a channel region of a semiconductor island 52 is formed also on the sidewall parts of semiconductor island 52. Therefore, dummy insulating films 45 formed on the sidewall parts of semiconductor island 52 function as gate insulating films. Specifically, part of the gate insulting film on the channel region 52c has a thickness different from that of the other part. Consideration is given to a resulting drawback that it adversely affects the control characteristics of the transistor, and the characteristics of the transistor cannot be enhanced.

As described above, conventionally, it was difficult to effectively prevent a dielectric breakdown without adversely affecting the characteristics of the transistor. It was also difficult to round off the upper side ends of the semiconductor layer without adversely affecting the semiconductor element formed in the lower layer.

SUMMARY OF THE INVENTION

One object of the present invention is to effectively prevent a dielectric breakdown of a gate insulating film without adversely affecting the control characteristics of a transistor in a semiconductor device.

Another object of the present invention is to effectively prevent electric field concentration in upper angular parts of a semiconductor layer in a SOI-transistor.

Still another object of the present invention is to round off upper angular parts of a semiconductor layer without adversely affecting a semiconductor element formed in a lower layer in a method of manufacturing a semiconductor device.

A further object of the present invention is to round off upper angular parts of a semiconductor layer without using heat treatment at a high temperature in a method of manufacturing a SOI-transistor.

To be brief, according to a first aspect of the present invention, a semiconductor device comprises an insulating layer, a semiconductor layer formed on the insulating layer and having a source/drain region, a gate insulating film formed on the semiconductor layer with an approximately uniform thickness, and a gate electrode formed on the gate insulating film. The transverse sectional form of the semiconductor layer includes a lower trapezoid having a bottom side in contact with the insulating layer, an upper side, and lateral sides and an upper trapezoid having a bottom side which is the upper side of the lower trapezoid, an upper side, and lateral sides, and the included angles between the bottom side and the lateral sides of the lower trapezoid are larger than the included angles between the bottom side and the lateral sides of the upper trapezoid.

In operation, the transverse sectional form of the semiconductor layer includes a lower trapezoid having a bottom side in contact with the insulating layer, an upper side, and lateral sides and an upper trapezoid having a bottom side which is the upper side of the lower trapezoid, an upper side, and lateral sides, and the included angles between the bottom side and the lateral sides of said lower trapezoid are larger than the included angles between the bottom side and the lateral sides of the upper trapezoid, so that electric field concentration in the upper angular parts of the semiconductor layer is reduced. Besides, the control characteristic of the transistor is enhanced in a case where the insulating film on the semiconductor layer is formed to be substantially uniform.

According to a second aspect of the present invention, a method of manufacturing a semiconductor device comprises the steps of forming a patterned semiconductor layer on an insulating layer, removing the upper angular parts of the semiconductor layer by performing sputter etching on the semiconductor layer, forming an insulating film on the semiconductor layer, and forming a gate electrode on the insulating film.

In operation, the upper angular parts of the patterned semiconductor layer on the insulating layer are removed by performing sputter etching on the semiconductor layer, so that the conventional heat treatment at a high temperature becomes unnecessary. As a result, the upper angular parts of the semiconductor layer are rounded off at a temperature not adversely affecting the semiconductor element of the lower layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the drawings.

Figure 1:
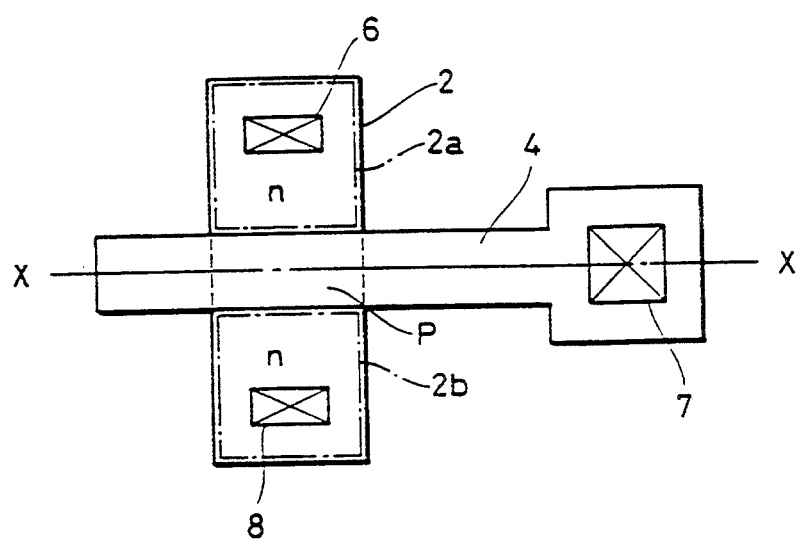
FIG. 1 is a plan view illustrating a semiconductor device according to one embodiment of the present invention.
Figure 2:
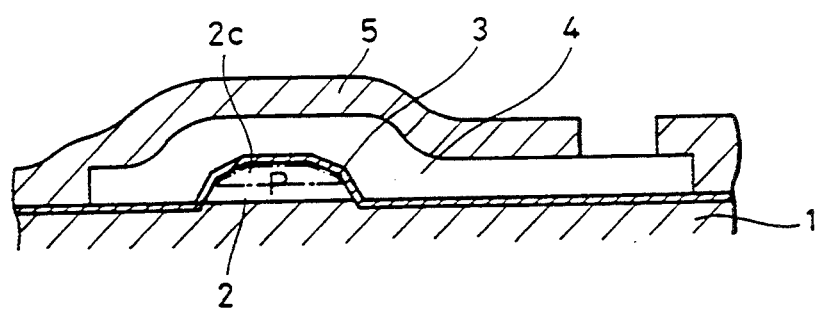
FIG. 2 is a sectional view of the semiconductor device illustrated in FIG. 1 taken along the line X—X.

Referring to FIGS. 1 and 2, the configuration of the semiconductor device according to the embodiment shown will be described.

The semiconductor device according to the embodiment shown comprises an insulating layer 1, a SOI film (a semiconductor film) 2 formed on insulating layer 1, a gate oxide film 3 formed on SOI film 2 with an approximately uniform thickness, a gate electrode 4 formed on gate oxide film 3, and an oxide film 5 formed on gate electrode 4.

n-type impurity regions 2a, 2b are formed on the surface of SOI film 2, extending in a direction crossing gate electrode 4 with a prescribed space between them. Specifically, n-type impurity regions 2a, 2b are formed from the upper surface of the SOI film toward the bottom surface to reach a prescribed depth. A channel region 2c is formed in the upper part of SOI film 2 under gate electrode 4 and also between n-type impurity regions 2a and 2b. The shape of SOI film 2 is such that the space in the direction along gate electrode 4 becomes narrower from the bottom surface of SOI film 2 toward the upper surface. SOI film 2 has two-beveled side surfaces extending from the bottom of SOI film 2 upward. More specifically, SOI film 2 is shaped like a stack of two smaller and larger trapezoids of different side bevels. As described previously, conventionally, a dielectric breakdown caused by electric field concentration in the upper angular parts was of problem. According to the present embodiment, however, it is possible to effectively prevent such a dielectric breakdown caused by electric field concentration in the upper angular parts by making the upper angular parts of SOI film 2 into obtuse angular shapes. As a result, it is possible to prevent malfunctions and so on of the transistor. This can enhance reliability of the transistor. On the other hand, according to the embodiment shown, the channel region formed between impurity regions 2a, 2b is covered with gate oxide film 3 having an uniform thickness. Therefore, it is also possible to enhance the control characteristics of the transistor. Furthermore, a source contact 6 is formed on the surface of impurity region 2a. A drain contact 8 is formed on the surface of impurity region 2b. A gate contact 7 is formed in a prescribed region of the gate electrode 4.

Figure 3:
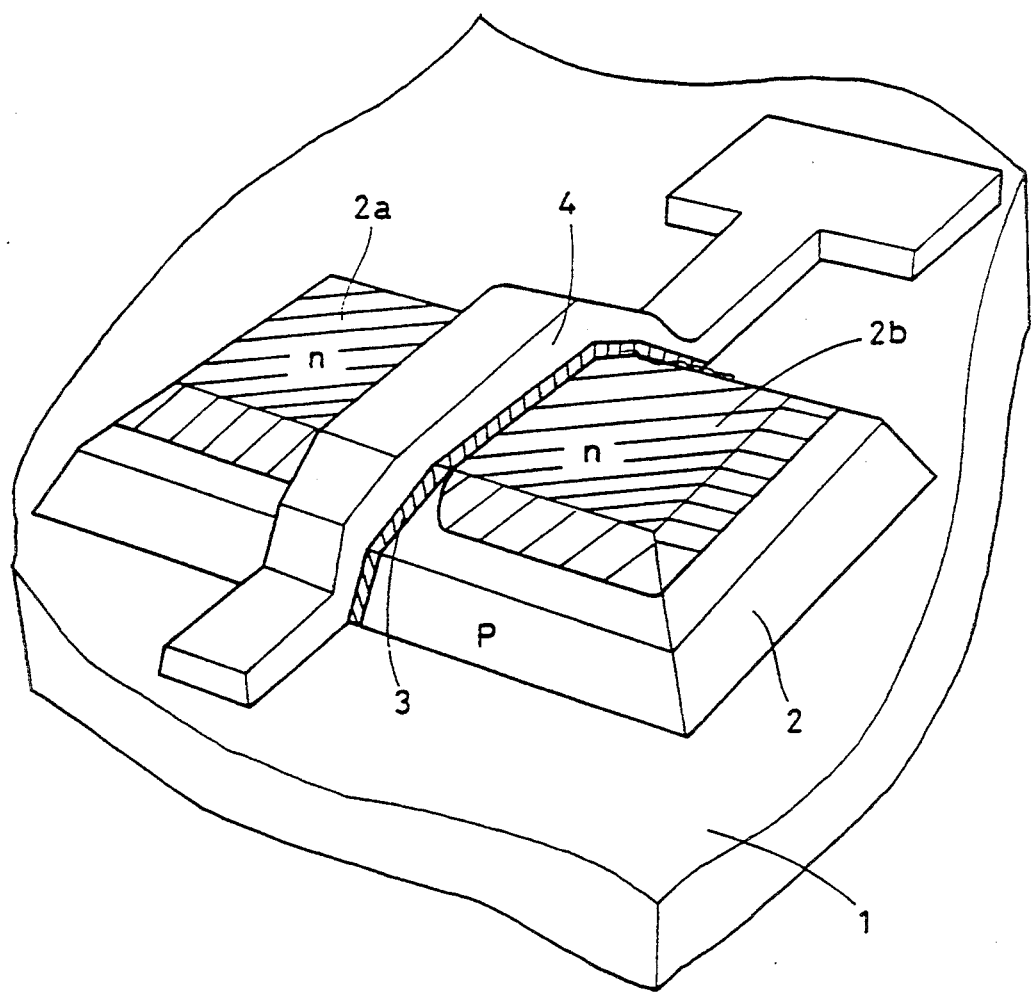
FIG. 3 is a perspective view of the semiconductor device illustrated in FIGS. 1 and 2.

Referring to FIG. 3, according to the embodiment shown, the outer form of SOI film 2 is defined by an upper surface, a bottom surface, and four side surfaces as illustrated. Then, SOI film 2 beneath gate oxide film 3 is shaped like a stack of two smaller and larger trapezoids of different bevels. Then, as described above, n-type impurity regions 2a, 2b are formed on the upper surface of SOI film 2 in a direction crossing gate electrode 4 with a prescribed space between them. Gate oxide film 3 on the channel region is formed with an approximately uniform thickness.

Now, referring to FIG. 4, a manufacturing process will be described.

Figure 4A:
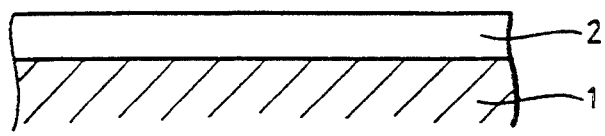
FIGS. 4(a)–(f) are a sectional view for describing a manufacturing process of the semiconductor device illustrated in FIG. 2.

First, as illustrated in FIG. 4(a), a SOI film 2 comprising a monocrystal silicon film having a thickness of approximately 5000 Å is formed on an insulating layer 1 comprising an oxide film having a thickness of 1 μm.

Figure 4B:
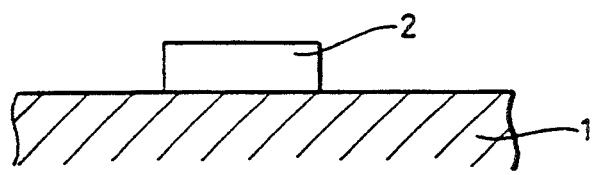

Next, as illustrated in FIG. 4(b), patterning is performed on SOI film 2 by anisotropic etching.

Figure 4C:
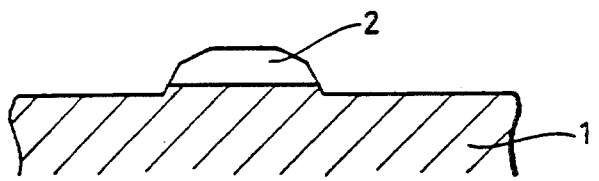

Next, as illustrated in FIG. 4(c), the upper angular parts of SOI film 2 are removed by sputter etching. Specifically, the upper angular parts of the SOI film are made into obtuse angular shapes by performing sputter etching with constant substrate bias voltage. These are disclosed, for example, in J. Vac. Sci. Tech., Vol. 14, No. 1, 1977, p281–p284.

Figure 4D:
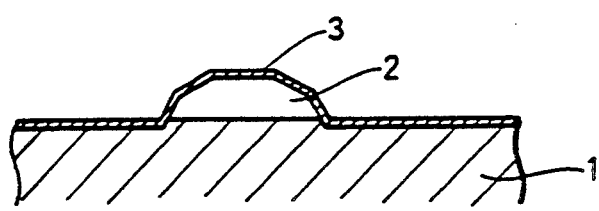

Next, as illustrated in FIG. 4(d), a gate oxide film 3 having an uniform thickness is formed on SOI film 2 using CVD method. Gate oxide film 3 may be formed by oxidation processing at 900° C. for a short time such as approximately 10 minutes (heat treatment to an extent that the characteristics of the element of the lower layer are not adversely affected).

Figure 4E:
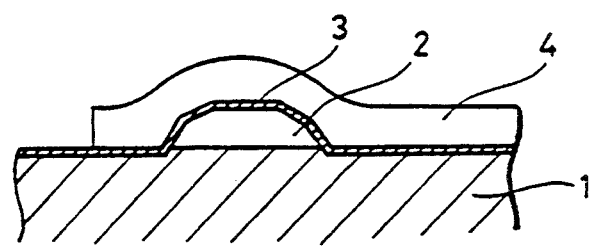

Next, as illustrated in FIG. 4(e), a gate electrode 4 comprising polysilicon is formed, and then patterning is performed on it.

Figure 4F:
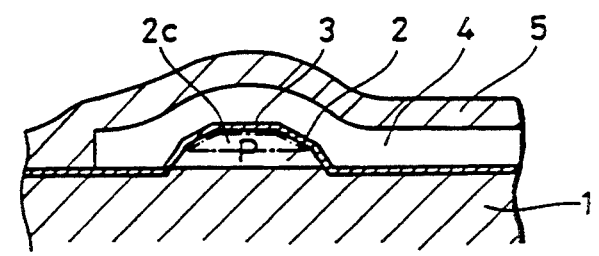
Figure 5:
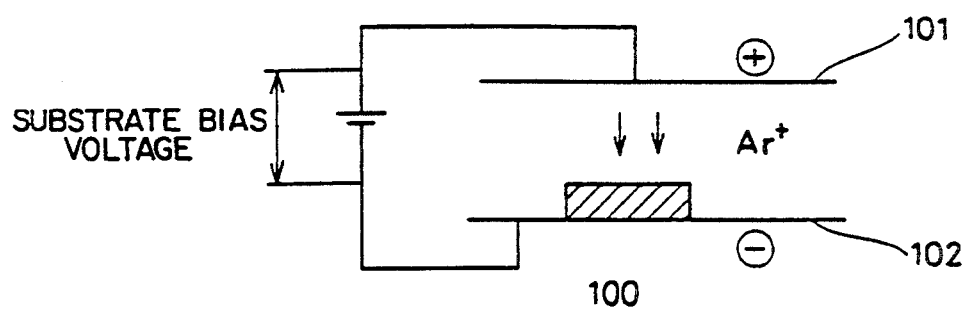
FIG. 5 is a typical diagram for describing the structure of an etching apparatus having a sputter etching function used in a sputter etching step described with reference to FIG. 4(c).
Figure 6:
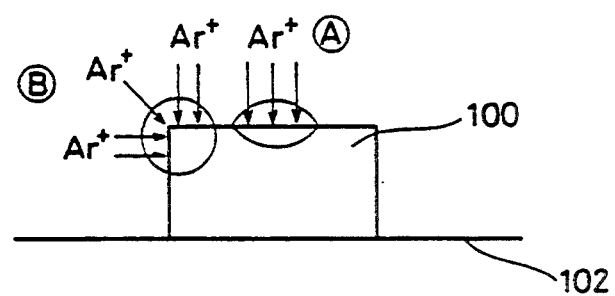
FIG. 6 is a schematic diagram for describing a state of etching by sputter etching.
Figure 7:
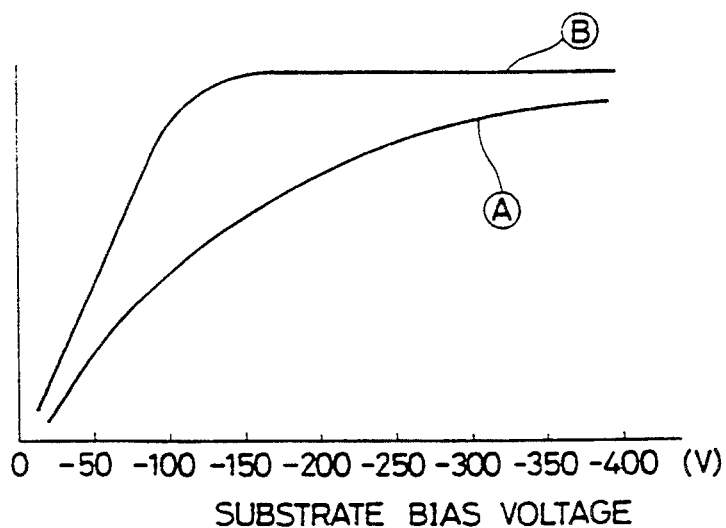
FIG. 7 is a graph showing the relation between the etching rates in an upper central part A and in an upper angular part B of an object to be etched and the substrate bias voltage.
Figure 8:
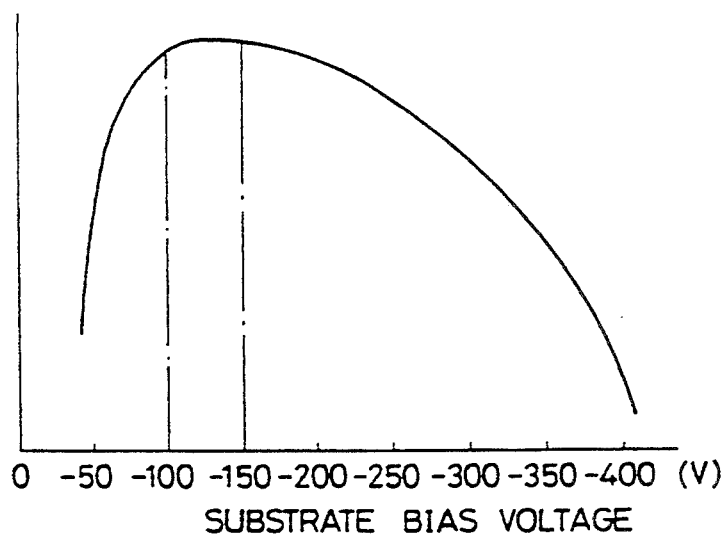
FIG. 8 is a graph showing the relation between the ratio of the etching rate in the upper angular part B shown in FIG. 7 to the etching rate in the upper central part A shown in FIG. 7 and the substrate bias voltage.

Next, as illustrated in FIG. 4(f), a n-type impurity region (not shown) is formed by performing ion implantation using gate electrode 4 as a mask. A channel region 2c is formed in the upper part of SOI film 2 under gate electrode 4 by this. An oxide film 5 is formed to cover gate electrode 4. Then, as illustrated in FIG. 2, a contact hole is provided, and a wafer process is completed. FIG. 5 is a typical diagram for describing the structure of an etching apparatus having a sputter etching function for carrying out the sputter etching described with reference to FIG. 4(c). FIG. 6 is a schematic diagram for describing a state of etching of the object to be etched illustrated in FIG. 5. FIG. 7 is a graph showing the relation between the etching rates in an upper central part A and an upper angular part B of the object 100 to be etched illustrated in FIG. 6 and the substrate bias voltage. FIG. 8 is a graph showing the relation between the ratio of the etching rate in part B shown in FIG. 7 to the etching rate in part A shown in FIG. 7 and the substrate bias voltage.

Now, referring to FIGS. 5–8, the sputter etching described with reference to FIG. 4(c) will be described in detail.

First, referring to FIG. 5, an etching apparatus having a sputter etching function includes an electrode plate 101 to which a plus voltage is applied and another electrode plate 102 which is arranged opposite electrode plate 101 and to which a minus voltage is applied. An object 100 to be etched is arranged on electrode plate 102. The space between electrode plate 101 and electrode plate 102 is filled with argon gas $Ar^+$. The following condition is necessary for carrying out sputter etching to make the object to be etched into the shape as illustrated in FIG. 4(c). Specifically, if sputter etching is carried out under the condition that the pressure of the Ar gas is in the range of 0.5 Pa to 3 Pa, and the substrate bias voltage is in the range of −10 V to −400 V, and the etching power density is in the range of 0.5 W/cm$^2$ to 4 W/cm$^2$, the object to be etched is made into the shape as illustrated in FIG. 4(c). The above condition is a condition in the case of a RF bias sputtering apparatus. If the pressure of the Ar gas is too low, plasma is not generated, and if the pressure is too high, discharge becomes unstable. If the substrate bias voltage is too low, plasma is not generated, and if the voltage is too high, irreparable damage to a device tends to be caused by plasma. If the etching power density is too low, etching takes too much time, and if the power density is too high, a problem related to the controllability of etching tends to arise.

Next, referring to FIG. 6, a reason why upper angular part B of object 100 to be etched is etched more than upper central part A will be described.

The provability that $Ar^+$ ions strike upper angular part B is higher than the provability that $Ar^+$ ions strike upper central part A. This is because there is a case where $Ar^+$ ions also strike upper angular part B from a lateral direction. While the sputter-etched parts of the object attach to upper central part A again, they do not attach to upper angular part B again. Therefore, upper angular part B tends to be etched more than upper central part A. Furthermore, electric field concentration occurs in upper angular part B. Therefore, $Ar^+$ ions tends to be attracted thereto, so that upper angular part B tend to be removed more.

Referring to FIG. 7, if a comparison is made between the etching rate in upper central part A and the etching rate in upper angular part B, the ratio of the etching rate in upper angular part B to the etching rate in upper central part A changes depending on the substrate bias voltage. Referring to FIG. 8, the ratio of the etching rate in upper angular part B to the etching rate in upper central part A is highest when the substrate bias voltage is in the range of −100 (V) to −150 (V). Specifically, when the substrate bias voltage is in the range of −100 (V) to −150 (V), the tendency for upper angular part B to be removed more than upper central part A is strongest. It is possible to round off upper angular part B if the substrate bias voltage is in the range of −10 (V) to −400 (V).

According to the embodiment shown, the upper angular parts of the SOI film are removed using sputter etching, so that it is possible to remove the upper angular parts of SOI film 2 under the temperature condition in the range of approximately a normal temperature to approximately 300° C. Therefore, it is possible to effectively prevent the dielectric breakdown caused by electric field concentration in gate oxide film 3 on SOI film 2 without adversely affecting the characteristics of the element in the lower layer.

Figure 9:
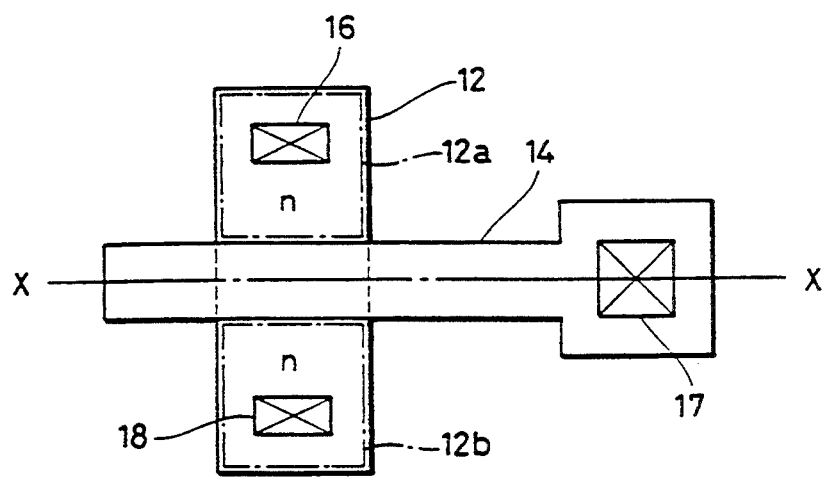
FIG. 9 is a plan view illustrating a semiconductor device according to another embodiment of the present invention.
Figure 10:
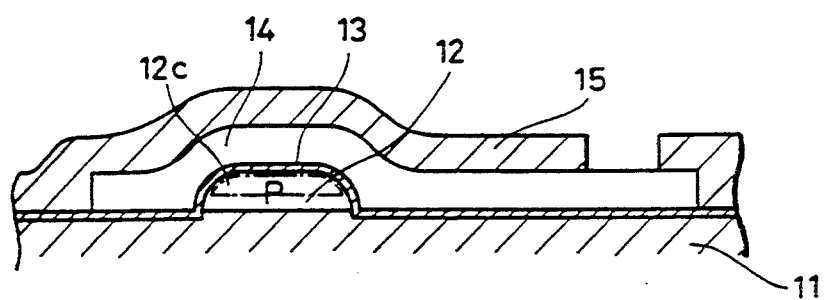
FIG. 10 is a sectional view of the semiconductor device illustrated in FIG. 5 taken along the line X—X.
Figure 11:
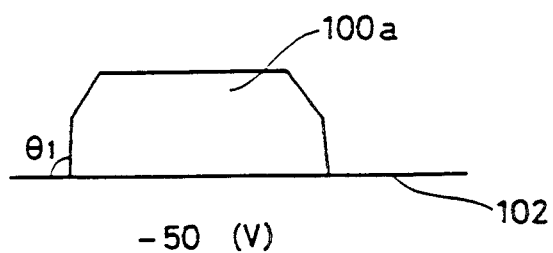
FIG. 11 is a typical diagram for describing the relation between the substrate bias voltage and the tilt angle of the lateral sides of an object to be etched.
Figure 12:
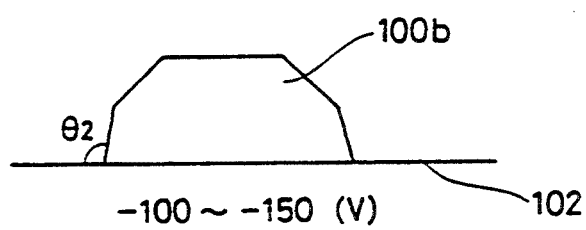
FIG. 12 is a typical diagram for describing the relation between the substrate bias voltage and the tilt angle of the lateral sides of an object to be etched.
Figure 13:
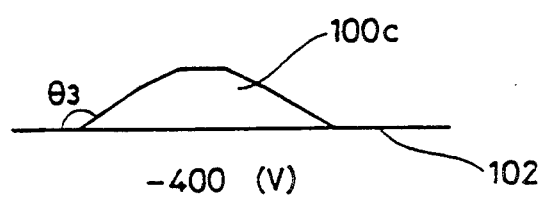
FIG. 13 is a typical diagram for describing the relation between the substrate bias voltage and the tilt angle of the lateral sides of an object to be etched.
Figure 14:
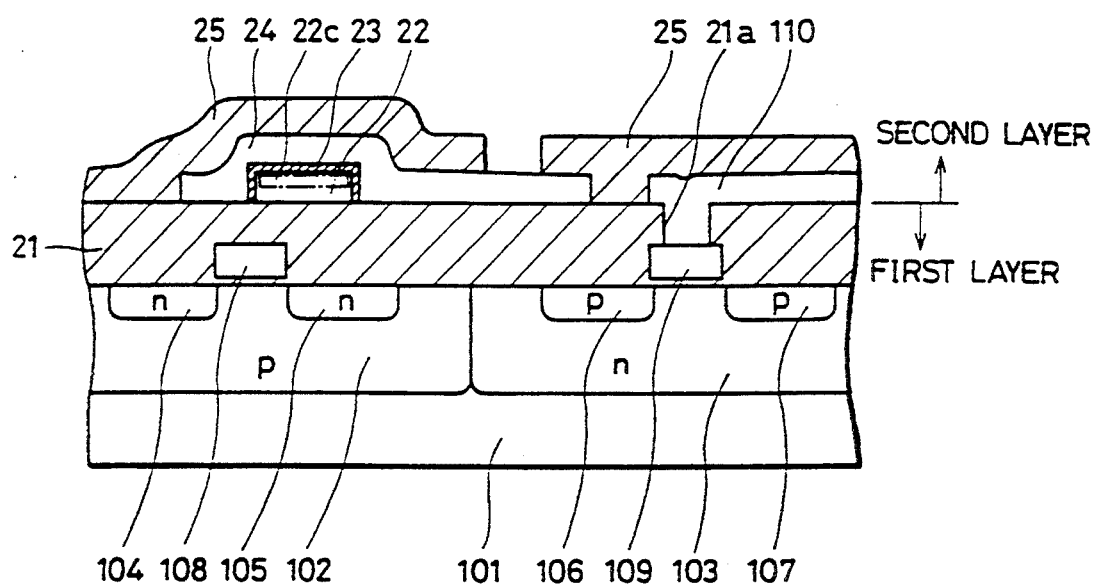
FIG. 14 is a sectional view illustrating a semiconductor device of a conventional SOI structure.
Figure 15:
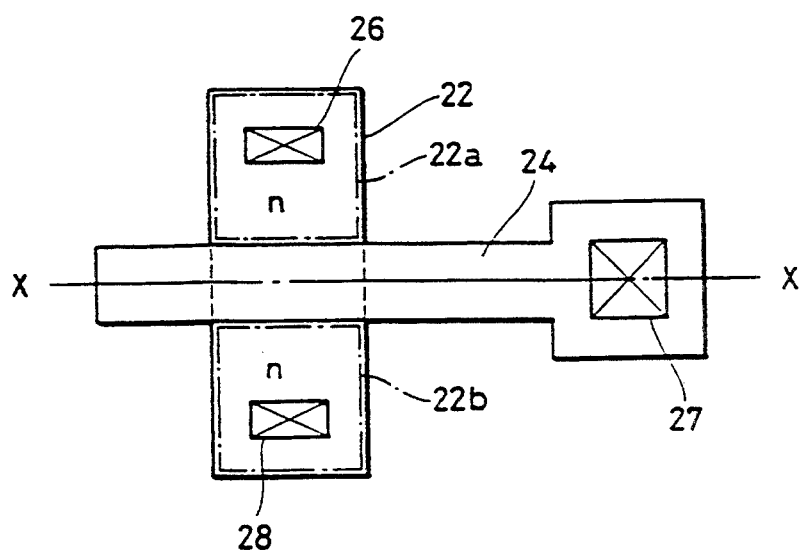
FIG. 15 is an enlarged plan view of the SOI structure portion of the semiconductor device illustrated in FIG. 7.
Figure 16:
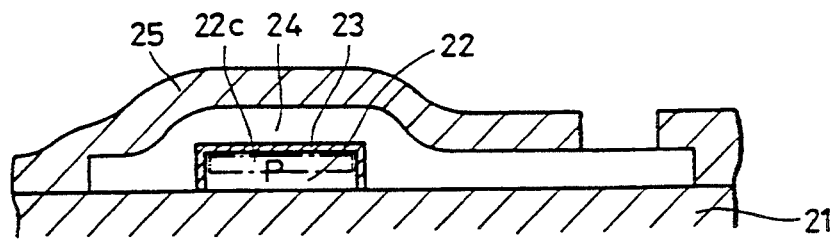
FIG. 16 is a sectional view of the semiconductor device illustrated in FIG. 8 taken along the line X—X.
Figure 17A:
FIGS. 17(a)–(e) are a sectional view for describing a manufacturing process of the semiconductor device illustrated in FIG. 9.
Figure 17B:
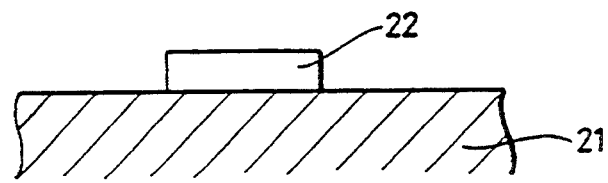
Figure 17C:
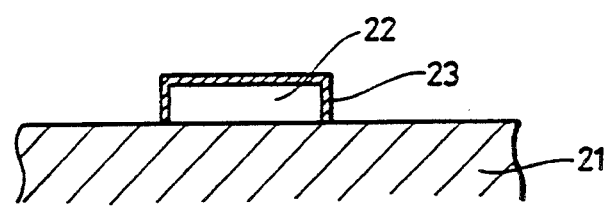
Figure 17D:
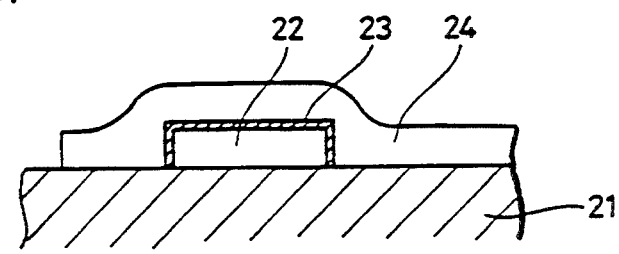
Figure 17E:
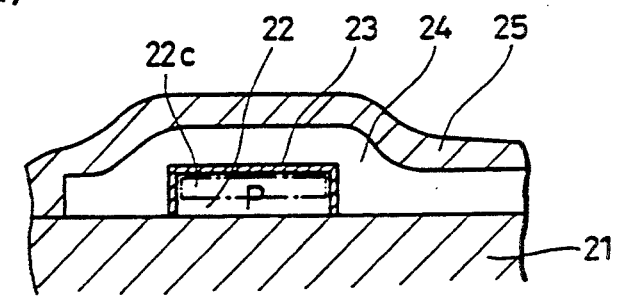
Figure 18:
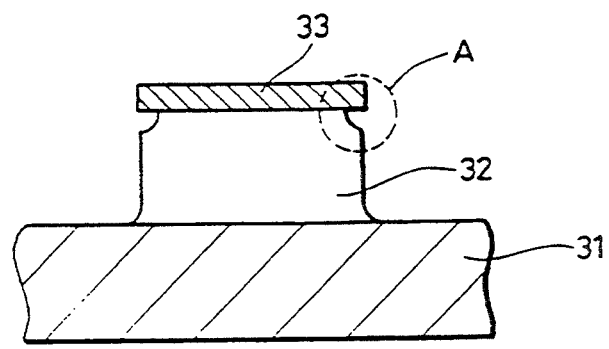
FIG. 18 is a sectional view illustrating a semiconductor device of a conventional proposed SOI structure.
Figure 19:
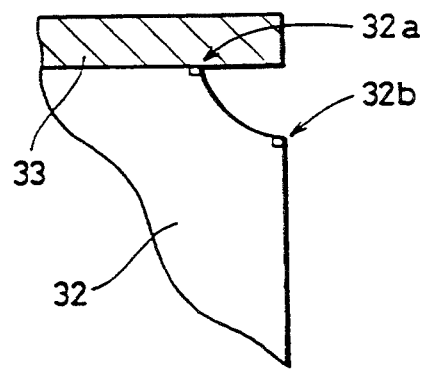
FIG. 19 is a partial enlarged view of the part A of the semiconductor device illustrated in FIG. 11.
Figure 20:
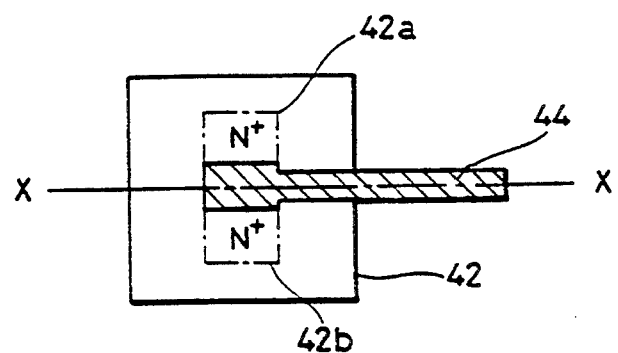
FIG. 20 is a plan view illustrating a semiconductor device of another conventional proposed SOI structure.
Figure 21:
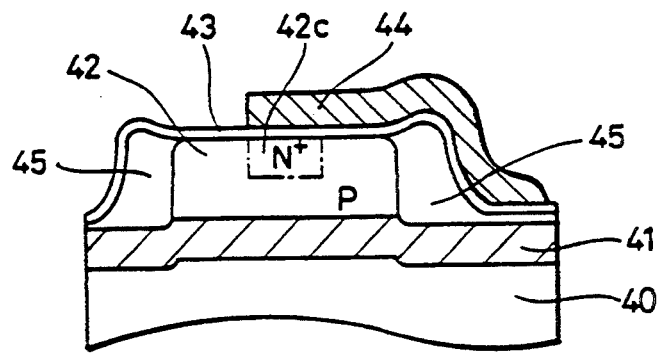
FIG. 21 is a sectional view of the semiconductor device illustrated in FIG. 13 taken along the line X—X.
Figure 22:
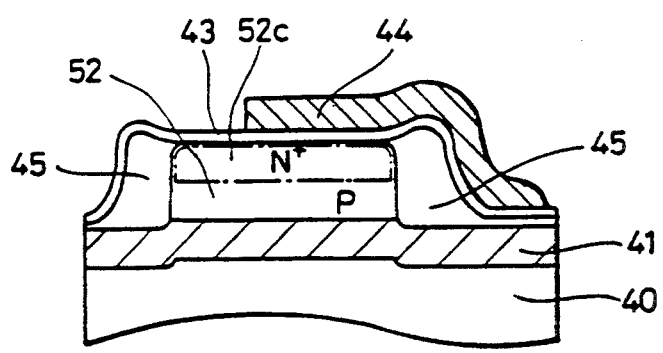
FIG. 22 is a sectional view illustrating an example in which the conventional proposed example illustrated in FIG. 14 is applied to the conventional semiconductor device illustrated in FIG. 9.

Referring to FIGS. 9 and 10, a semiconductor device according to another embodiment of the present invention comprises an insulating film 11, a SOI film 12 formed on insulating film 11, a gate oxide film 13 formed to cover SOI film 12, a gate electrode 14 formed on gate oxide film 13, and an oxide film 15 formed on gate electrode 14. n-type impurity regions 12a, 12b are formed on SOI film 12 in a direction crossing gate electrode 14 with a prescribed space between them. A source contact 16 is formed in impurity region 12a. A drain contact 18 is formed in impurity region 12b. A gate contact 17 is formed in a prescribed region of gate electrode 14. Now, in the semiconductor device according to this embodiment, the upper side ends of SOI film 12 have arcuate shapes. By doing so, it is also possible to obtain the same effects as that of the embodiment illustrated in FIG. 2. Specifically, it is possible to effectively prevent the dielectric breakdown caused by electric field concentration in the upper side ends of SOI film 12. In addition, the thickness of gate oxide film 13 formed on the channel region is made almost uniform, so that it is possible to enhance the control characteristics of the transistor. The arcuate shapes of the upper side ends of SOI film 12 can be easily formed using the sputter etching method. More specifically, it is possible to form the upper side ends of SOI film 12 in arcuate shapes by successively changing the substrate bias voltage during sputter etching. FIGS. 11, 12, and 13 are typical diagrams for explaining the relation between the substrate bias voltage and the tilt angle of the lateral sides of an object to be etched. Referring to FIGS. 11 to 13, when the substrate bias voltage is −50 (V), the tilt angle of the lateral sides of an object 100a to be etched becomes $\theta_1$, when the substrate bias voltage is in the range of −100 (V) to −150 (V), the tilt angle of the lateral sides of an object 100b to be etched becomes 82, and when the substrate bias voltage is −400 (V), the tilt angle of the lateral sides of an object 100c to be etched becomes $\theta_3$. Thus, it is possible to control the tilt angle of the lateral sides of an object to be etched easily by changing the substrate bias voltage. Accordingly, it is possible to form the upper side ends of SOI film 12 (see FIG. 10) in arcuate shapes easily by successibly changing the substrate bias voltage during sputter etching. As described above, according to this embodiment, it is also possible to round off the upper angular parts of SOI film 12 by sputter etching, so that the element in the lower layer is not influenced.

As described above, in a semiconductor device according to the present invention, electric concentration in the upper angular parts of the semiconductor layer is decreased by forming the semiconductor layer so that its transverse sectional form includes a lower trapezoid including a bottom side in contact with the insulating layer, an upper side, and lateral sides and an upper trapezoid including a bottom side which is the upper side of the lower trapezoid, an upper side, and lateral sides, and so that the included angles between the bottom side and the lateral sides of the lower trapezoid are larger than the included angles between the bottom side and the lateral sides of the upper trapezoid. In addition, the control characteristics of the transistor are enhanced by forming the insulating film almost uniformly on the semiconductor layer. As a result, it is possible to effectively prevent a dielectric breakdown without adversely affecting the characteristics of the transistor.

Furthermore, in the method of manufacturing the semiconductor device according to the present invention, the upper angular parts of the semiconductor layer are removed by performing sputter etching on the semiconductor layer, so that the conventional heat treatment at a high temperature becomes unnecessary. Consequently, the upper angular parts of the semiconductor layer are rounded off at a temperature not adversely affecting the semiconductor element in the lower layer. Accordingly, it is possible to round off the upper angular parts of the semiconductor layer without adversely affecting the semiconductor element formed in the lower layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an insulating layer;
   a semiconductor layer formed on said insulating layer to define source/drain regions and having bottom surface adjacent said insulating layer and upper surface opposite to said bottom surface;
   a gate insulating film covering the upper surface of said semiconductor layer with a substantially uniform thickness; and
   a gate electrode formed on said gate insulating film; wherein the two opposed side surfaces of said semiconductor layer placed beneath said gate electrode are arcuate surfaces extending from said bottom surface to said upper surface and said side surfaces of said semiconductor layer are concave with respect to a surface of said semiconductor layer enclosed with said side surfaces, and wherein the entire side surfaces of said semiconductor layer located beneath said gate electrode are arcuate surfaces.

2. A semiconductor device comprising:
   an insulating layer;
   a semiconductor layer of common conductivity type throughout formed on said insulating layer to define source/drain regions and having bottom surface adjacent said insulating layer and upper surface opposite to said bottom surface, the impurity concentration of said semiconductor layer around the entire periphery thereof being no greater than that at a central region thereof;
   a gate insulating film covering the upper surface of said semiconductor layer with a substantially uniform thickness; and
   a gate electrode formed on said gate insulating film; wherein the two opposed side surfaces of said semiconductor layer placed beneath said gate electrode are arcuate surfaces extending from said bottom surface to said upper surface and said side surfaces of said semiconductor layer are concave with respect to a surface of said semiconductor layer enclosed with said side surfaces.

* * * * *

UNITED STATES PATENT AND TRADEMARK OFFICE
CERTIFICATE OF CORRECTION

PATENT NO. : 5,446,301
DATED : August 29, 1995
INVENTOR(S) : Koji EGUCHI et al.

It is certified that error appears in the above-indentified patent and that said Letters Patent is hereby corrected as shown below:

On the title page, Item [*] should read as follows:

--[*] Notice: The portion of the term of this patent subsequent to February 21, 2012 has been disclaimed.--

Signed and Sealed this

Thirtieth Day of July, 1996

Attest:

BRUCE LEHMAN

*Attesting Officer*   *Commissioner of Patents and Trademarks*